United States Patent
Lin et al.

(10) Patent No.: US 9,608,578 B2
(45) Date of Patent: Mar. 28, 2017

(54) LOW NOISE AMPLIFIER

(71) Applicant: National Chi Nan University, Pui, Nantou (TW)

(72) Inventors: Yo-Sheng Lin, Nantou (TW); Sin-Chen Lin, Nantou (TW)

(73) Assignee: NATIONAL CHI NAN UNIVERSITY, Puli, Nantou (TW)

( * ) Notice: Subject to any disclaimer, the term of this patent is extended or adjusted under 35 U.S.C. 154(b) by 0 days.

(21) Appl. No.: 14/838,434

(22) Filed: Aug. 28, 2015

(65) Prior Publication Data

US 2016/0233839 A1   Aug. 11, 2016

(30) Foreign Application Priority Data

Feb. 6, 2015   (TW) .............................. 104104077 A

(51) Int. Cl.
*H03F 3/191*   (2006.01)
*H03F 1/22*   (2006.01)
*H03F 1/56*   (2006.01)
*H03F 3/193*   (2006.01)
*H03F 3/60*   (2006.01)

(52) U.S. Cl.
CPC ............. *H03F 1/565* (2013.01); *H03F 1/223* (2013.01); *H03F 3/193* (2013.01); *H03F 3/601* (2013.01); *H03F 2200/222* (2013.01); *H03F 2200/294* (2013.01); *H03F 2200/318* (2013.01); *H03F 2200/387* (2013.01); *H03F 2200/411* (2013.01)

(58) Field of Classification Search
CPC . H03F 1/22; H03F 1/223; H03F 3/191; H03F 3/193

USPC ................................. 330/302, 306, 311, 283
See application file for complete search history.

(56) References Cited

U.S. PATENT DOCUMENTS 6,462,622 B1 * 10/2002 Mori ..................... H03F 1/3205
                                                              330/302
2006/0001492 A1 * 1/2006 Chang .................... H03F 3/191
                                                              330/306

OTHER PUBLICATIONS

Taiwanese Search Report and English Translation for corresponding Taiwanese Patent Application No. 104104077, mailed Apr. 7, 2016.
Yo-Sheng Lin et al., "A 9.99 mW low-noise amplifier for 60GHz WPAN system and 77 GHz automobile radar system in 90 nm CMOS", IEEE Radio and Wireless Symposium (RWS), 2015 IEEE; pp. 65-67, Jan. 25-28, 2015.
N. Demirel et al., "Millimeter-Wave Chip Set for 77-81 GHz Automotive Radar Application", 2011 IEEE New Circuits and Systems Conference (NEWCAS), pp. 253-256.

(Continued)

*Primary Examiner* — Steven J Mottola
(74) *Attorney, Agent, or Firm* — Merchant & Gould P.C.

(57) ABSTRACT

A low noise amplifier includes a T-type circuit, a first amplification module and a second amplification module. The T-type circuit is adapted to receive an input signal from a signal source, filters the input signal to generate a filtered signal, and is configured such that an equivalent input impedance seen into the T-type circuit matches an equivalent output impedance seen into the signal source. The first amplification module is coupled to the T-type circuit for receiving the filtered signal therefrom, and amplifies the filtered signal to generate an amplified signal. The second amplification module is coupled to the first amplification module for receiving the amplified signal therefrom, and amplifies the amplified signal to generate an output signal.

18 Claims, 3 Drawing Sheets

(56) References Cited

OTHER PUBLICATIONS

Austin Ying-Kuang Chen et al., "A Low-Power Linear SiGe BiCMOS Low-Noise Amplifier for Millimeter-Wave Active Imaging", IEEE Microwave and Wireless Components Letters, vol. 20, No. 2, Feb. 2010, pp. 103-105.
H. V. Le et al., "A 77 GHz CMOS Low Noise Amplifier for Automotive Radar Receiver", 2012 IEEE International Symposium on Radio-Frequency Integration Technology (RFIT), pp. 174-176.
Ahmet çagri Ulusoy et al., "A 60 to 77 GHz Switchable LNA in an RF-MEMS Embedded BiCMOS Technology", IEEE Microwave and Wireless Components Letters, vol. 22, No. 8, Aug. 2012, pp. 430-432.

* cited by examiner

LOW NOISE AMPLIFIER

CROSS-REFERENCE TO RELATED APPLICATION

This application claims priority of Taiwanese Application No. 104104077, filed on Feb. 6, 2015.

FIELD

The disclosure relates to an amplifier, and more particularly to a low noise amplifier.

BACKGROUND

A first conventional low noise amplifier is disclosed in "Millimeter-Wave Chip Set for 77-81 GHz Automotive Radar Application" by N. Demirel et al., IEEE New Circuits and Systems Conference (NEWCAS), pp. 253-256, 2011. A second conventional low noise amplifier is disclosed in "A Low-Power Linear SiGe BiCMOS Low-Noise Amplifier for Millimeter-Wave Active Imaging" by A. Y. K. Chen et al., IEEE Microwave and Wireless Components Letters (MWCL), vol. 20, no. 2, pp. 103-105, February 2010. A third conventional low noise amplifier is disclosed in "A 77 GHz CMOS Low Noise Amplifier for Automotive Radar Receiver" by H. V. Le et al., IEEE Radio-Frequency Integration Technology (RFIT), pp. 174-176, 2012. A fourth conventional low noise amplifier is disclosed in "A 60 to 77 GHz Switchable LNA in an RF-MEMS Embedded BiCMOS Technology" by A. C. Ulusoy et al., IEEE MWCL, vol. 22, no. 8, pp. 430-432, 2012. Measurement results of the above-mentioned conventional low noise amplifiers are shown in Table 1. It is known from Table 1 that each conventional low noise amplifier advantageously has a relatively high conversion gain but disadvantageously has a relatively high noise figure.

TABLE 1

| | conversion gain (dB) | noise figure (dB) |
|---|---|---|
| 2011 NEWCAS | 8.5 ± 1.5 | 7.2 |
| 2010 MWCL | 13.8 ± 0.7 | 6.9 |
| 2012 RFIT | 11 | 7.8 |
| 2012 MWCL | 21.3 | 7.6 |

SUMMARY

Therefore, an object of the disclosure is to provide a low noise amplifier that can overcome the aforesaid drawback of the prior arts.

According to the disclosure, a low noise amplifier includes a T-type circuit, a first amplification module and a second amplification module.

The T-type circuit is adapted to be coupled to a signal source for receiving an input signal therefrom, filters the input signal to generate a filtered signal, and is configured such that an equivalent input impedance seen into the T-type circuit matches an equivalent output impedance seen into the signal source.

The first amplification module is coupled to the T-type circuit for receiving the filtered signal therefrom, and amplifies the filtered signal to generate an amplified signal.

The second amplification module is coupled to the first amplification module for receiving the amplified signal therefrom, and amplifies the amplified signal to generate an output signal.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
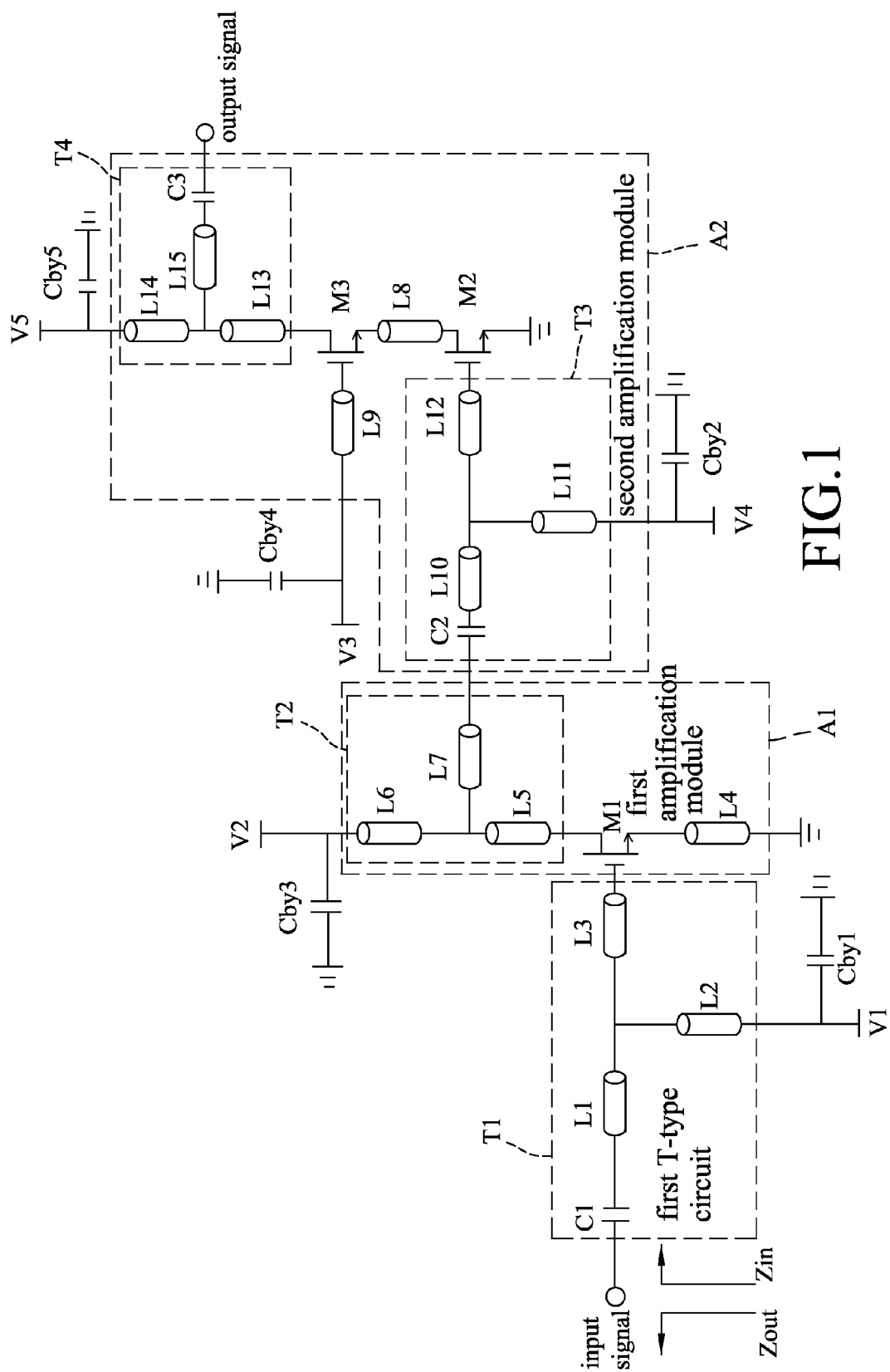
FIG. 1 is a circuit diagram illustrating an embodiment of a low noise amplifier according to the disclosure.

Referring to FIG. 1, an embodiment of a low noise amplifier according to the disclosure is adapted to be coupled to a signal source (not shown) generating an input signal and to an end terminal circuit (not shown), and includes a first T-type circuit (T1), a first amplification module (A1), a second amplification module (A2), a first bypass capacitor (Cby1), a second bypass capacitor (Cby2), a third bypass capacitor (Cby3), a fourth bypass capacitor (Cby4) and a fifth bypass capacitor (Cby5).

The first T-type circuit (T1) is adapted to be coupled to the signal source for receiving the input signal, and filters the input signal to generate a filtered signal. In this embodiment, the first T-type circuit (T1) includes a first capacitor (C1), a first inductor (L1), a second inductor (L2) and a third inductor (L3).

The first capacitor (C1) has a first terminal that is adapted to be coupled to the signal source for receiving the input signal therefrom, and a second terminal.

The first inductor (L1) has a first terminal that is coupled to the second terminal of the first capacitor (C1), and a second terminal.

The second inductor (L2) has a first terminal that is coupled to the second terminal of the first inductor (L1), and a second terminal that is adapted to receive a first voltage (V1).

The third inductor (L3) has a first terminal that is coupled to the second terminal of the first inductor (L1), and a second terminal that outputs the filtered signal.

The first amplification module (A1) is coupled to the first T-type circuit (T1) for receiving the filtered signal therefrom, and amplifies the filtered signal to generate an amplified signal. In this embodiment, the first amplification module (A1) includes a first transistor (M1), a fourth inductor (L4) and a second T-type circuit (T2).

The first transistor (M1) has a first terminal, a second terminal, and a control terminal that is coupled to the second terminal of the third inductor (L3) of the first T-type circuit (T1) for receiving the filtered signal therefrom.

The fourth inductor (L4) is coupled between the second terminal of the first transistor (M1) and ground.

The second T-type circuit (T2) is coupled to the first terminal of the first transistor (M1), and outputs the amplified signal. In this embodiment, the second T-type circuit (T2) includes a fifth inductor (L5), a sixth inductor (L6) and a seventh inductor (L7).

The fifth inductor (L5) has a first terminal, and a second terminal that is coupled to the first terminal of the first transistor (M1).

The sixth inductor (L6) has a first terminal that is adapted to receive a second voltage (V2), and a second terminal that is coupled to the first terminal of the fifth inductor (L5).

The seventh inductor (L7) has a first terminal that is coupled to the first terminal of the fifth inductor (L5), and a second terminal that outputs the amplified signal.

The second amplification module (A2) is coupled to the first amplification module (A1) for receiving the amplified signal therefrom, is adapted to be coupled to the end terminal circuit, and amplifies the amplified signal to generate an output signal. In this embodiment, the second amplification module (A2) includes a third T-type circuit (T3), a second transistor (M2), an eighth inductor (L8), a third transistor (M3), a ninth inductor (L9) and a fourth T-type circuit (T4).

The third T-type circuit (T3) is coupled to the second terminal of the seventh inductor (L7) of the second T-type circuit (T2) for receiving the amplified signal therefrom.

The second transistor (M2) has a first terminal, a second terminal that is coupled to ground, and a control terminal that is coupled to the third T-type circuit (T3).

The eighth inductor (L8) has a first terminal, and a second terminal that is coupled to the first terminal of the second transistor (M2).

The third transistor (M3) has a first terminal, a second terminal that is coupled to the first terminal of the eighth inductor (L8), and a control terminal.

The ninth inductor (L9) has a first terminal that is coupled to the control terminal of the third transistor (M3), and a second terminal that is adapted to receive a third voltage (V3).

The fourth T-type circuit (T4) is coupled to the first terminal of the third transistor (M3) and the end terminal circuit, and outputs the output signal to the end terminal circuit.

In this embodiment, the third T-type circuit (T3) includes a second capacitor (C2), a tenth inductor (L10), an eleventh inductor (L11) and a twelfth inductor (L12).

The second capacitor (C2) has a first terminal that is coupled to the second terminal of the seventh inductor (L7) of the second T-type circuit (T2) for receiving the amplified signal therefrom, and a second terminal.

The tenth inductor (L10) has a first terminal that is coupled to the second terminal of the second capacitor (C2), and a second terminal.

The eleventh inductor (L11) has a first terminal that is coupled to the second terminal of the tenth inductor (L10), and a second terminal that is adapted to receive a fourth voltage (V4).

The twelfth inductor (L12) is coupled between the second terminal of the tenth inductor (L10) and the control terminal of the second transistor (M2).

In this embodiment, the fourth T-type circuit (T4) includes a thirteenth inductor (L13), a fourteenth inductor (L14), a fifteenth inductor (L15) and a third capacitor (C3).

The thirteenth inductor (L13) has a first terminal, and a second terminal that is coupled to the first terminal of the third transistor (M3).

The fourteenth inductor (L14) has a first terminal that is adapted to receive a fifth voltage (V5), and a second terminal that is coupled to the first terminal of the thirteenth inductor (L13).

The fifteenth inductor (L15) has a first terminal that is coupled to the first terminal of the thirteenth inductor (L13), and a second terminal.

The third capacitor (C3) has a first terminal that is coupled to the second terminal of the fifteenth inductor (L15), and a second terminal that is coupled to the end terminal circuit for outputting the output signal thereto.

The first bypass capacitor (Cby1) is coupled to the second terminal of the second inductor (L2) of the first T-type circuit (T1). The second bypass capacitor (Cby2) is coupled to the second terminal of the eleventh inductor (L11) of the third T-type circuit (T3). The third bypass capacitor (Cby3) is coupled to the first terminal of the sixth inductor (L6) of the second T-type circuit (T2). The fourth bypass capacitor (Cby4) is coupled to the second terminal of the ninth inductor (L9). The fifth bypass capacitor (Cby5) is coupled to the first terminal of the fourteenth inductor (L14) of the fourth T-type circuit (T4).

In this embodiment, each of the first to third transistors (M1-M3) is an N-type metal oxide semiconductor field effect transistor. The first terminal of each transistor (M1-M3) is a drain terminal, the second terminal of each transistor (M1-M3) is a source terminal, and the control terminal of each transistor (M1-M3) is a gate terminal.

In this embodiment, each of the first to fifteenth inductors (L1-L15) is a transmission line inductor. The first to third inductors (L1-L3) of the first T-type circuit (T1) are configured such that an equivalent input impedance (Zin) seen into the first T-type circuit (T1) from the first terminal of the first capacitor (C1) matches an equivalent output impedance (Zout) seen into the signal source. The fifth to seventh inductors (L5-L7) of the second T-type circuit (T2) and the tenth to twelfth inductors (L10-L12) of the third T-type circuit (T3) are configured such that an equivalent input impedance seen into the second amplification module (A2) from the first terminal of the second capacitor (C2) of the third T-type circuit (T3) matches an equivalent output impedance seen into the first amplification module (A1) from the second terminal of the seventh inductor (L7) of the second T-type circuit (T2). The thirteenth to fifteenth inductors (L13-L15) of the fourth T-type circuit (T4) are configured such that an equivalent output impedance seen into the second amplification module (A2) from the second terminal of the third capacitor (C3) of the fourth T-type circuit (T4) matches an equivalent input impedance seen into the end terminal circuit.

Figure 2:
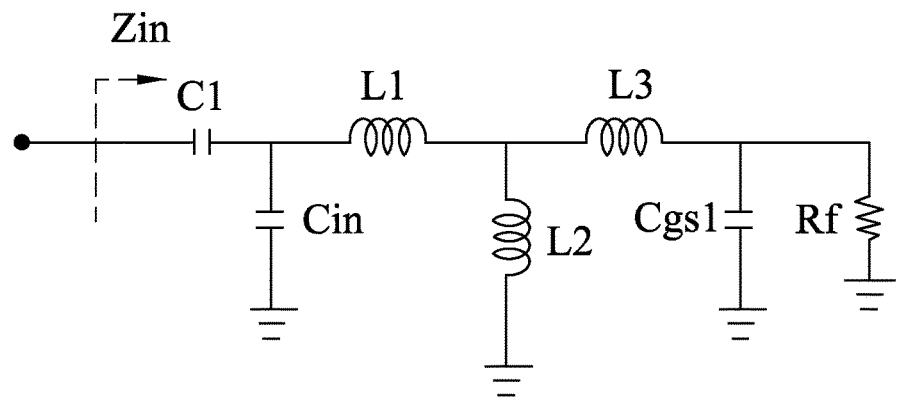
FIG. 2 is a circuit diagram illustrating a first equivalent circuit of the embodiment in small signal analysis.

Referring to FIGS. 1 and 2, a first equivalent circuit of the low noise amplifier of this embodiment in small signal analysis is depicted in FIG. 2. The first equivalent circuit includes the first capacitor (C1), the first to third inductors (L1-L3), an input equivalent capacitor (Cin) seen from the first terminal of the first inductor (L1) to the second terminal of the third inductor (L3), a parasitic capacitor (Cgs1) formed between the control and second terminals of the first transistor (M1), and an equivalent resistor (Rf) seen into the first transistor (M1) from the control terminal thereof.

Figure 3:
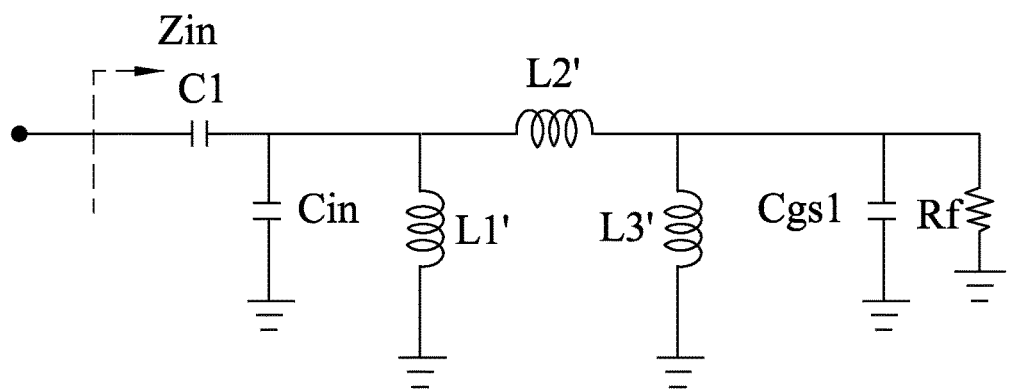
FIG. 3 is a circuit diagram illustrating a second equivalent circuit of the embodiment in small signal analysis.

Referring to FIGS. 2 and 3, a second equivalent circuit of the low noise amplifier of this embodiment in small signal analysis is depicted in FIG. 3. The first to third inductors (L1-L3) coupled to each other in a T shape as shown in FIG. 2 can be replaced by first, second and third equivalent inductors (L1'-L3') coupled to each other in a π shape as shown in FIG. 3. Inductances (l1'-l3') of the first to third equivalent inductors (L1'-L3') are respectively expressed by the following Equations 1-3:

$$l1' = \frac{l1 \times l2 + l2 \times l3 + l3 \times l1}{l3} \quad \text{Equation 1}$$

$$l2' = \frac{l1 \times l2 + l2 \times l3 + l3 \times l1}{l2} \quad \text{Equation 2}$$

$$l3' = \frac{l1 \times l2 + l2 \times l3 + l3 \times l1}{l1} \quad \text{Equation 3}$$

where l1, l2 and l3 respectively denote inductances of the first to third inductors (L1-L3).

Figure 4:
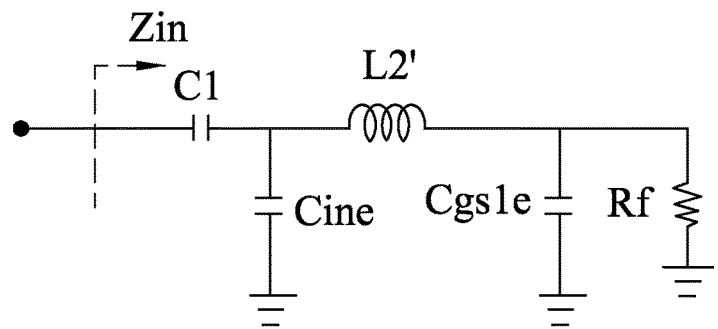
FIG. 4 is a circuit diagram illustrating a third equivalent circuit of the embodiment in small signal analysis.

Referring to FIGS. 3 and 4, a third equivalent circuit of the low noise amplifier of this embodiment in small signal analysis is depicted in FIG. 4. When the low noise amplifier of this embodiment operates in the frequency band(s) of interest, the first equivalent inductor (L1') cooperates with a portion of the input equivalent capacitor (Cin) to form an open circuit, and the third equivalent inductor (L3') cooperates with a portion of the parasitic capacitor (Cgs1) to form an open circuit. Therefore, the first equivalent inductor (L1') and the input equivalent capacitor (Cin) that are coupled in parallel as shown in FIG. 3 can be replaced by a first equivalent capacitor (Cine) shown in FIG. 4, and the third equivalent inductor (L3') and the parasitic capacitor (Cgs1) that are coupled in parallel as shown in FIG. 3 can be replaced by a second equivalent capacitor (Cgs1e) shown in FIG. 4. Capacitances (cine, cgs1e) of the first and second equivalent capacitors (Cine, Cgs1e) are respectively expressed by the following Equations 4, 5:

$$cine = \frac{cin}{2} \sim \frac{cgs1}{2} \quad \text{Equation 4}$$

$$cgs1e = \frac{cgs1}{2} \quad \text{Equation 5}$$

where cin denotes a capacitance of the input equivalent capacitor (Cin), and cgs1 denotes a capacitance of the parasitic capacitor (Cgs1).

It is known from FIG. 4 that a filtering function is provided for preventing noise contained in the input signal from entering the first amplification module (A1). Therefore, the output signal contains relatively low noise, which results in a relatively low noise figure.

In addition, since the low noise amplifier of this embodiment is a multi-stage amplifier, in which the first amplification module (A1) is a common source amplification module and the second amplification module (A2) is a cascode amplification module, the low noise amplifier of this embodiment has a relatively high conversion gain.

Moreover, with each of the first to fifth inductors (L1-L15) being the transmission line inductor, the low noise amplifier of this embodiment can operate at a relatively high frequency.

Measurement results of the low noise amplifier of this embodiment are shown in Table 2. Compared with the measurement results of the conventional low noise amplifiers as shown in Table 1, the noise figure of the low noise amplifier of this embodiment is lower than the noise figure of each of the conventional low noise amplifiers, and the conversion gain of the low noise amplifier of this embodiment is higher than the conversion gain of certain ones of the conventional low noise amplifiers (i.e., 2011 NEWCAS and 2012 RFIT).

TABLE 2

|  | conversion gain (dB) | noise figure (dB) |
|---|---|---|
| this embodiment | 11.2 ± 1.5 | 4.8 |

Figure 5:
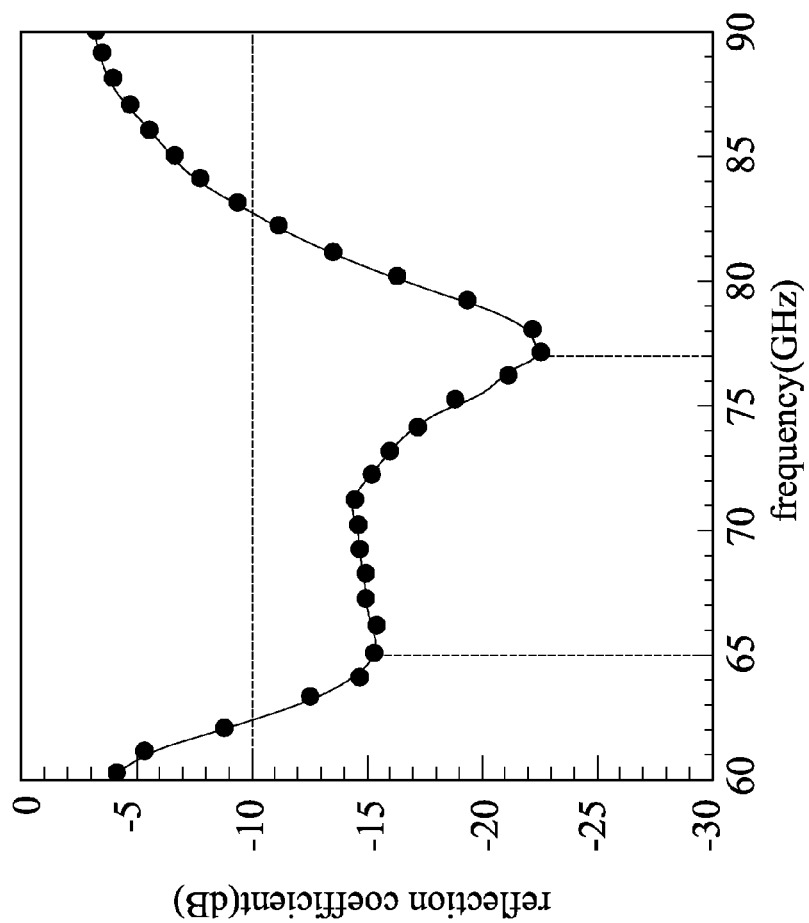
FIG. 5 is a schematic diagram illustrating reflection coefficient versus frequency characteristic of the embodiment.

FIG. 5 illustrates simulated reflection coefficient versus frequency characteristic of the low noise amplifier of this embodiment. It is known from FIG. 5 that, since impedance matching between the first T-type circuit (T1) and the signal source is relatively good, the reflection coefficient is smaller than −10 db in a frequency band of 63-82 GHz. In particular, the low noise amplifier of this embodiment has a relatively good impedance matching (i.e., a relatively small reflection coefficient) when operating in a high frequency band of 77 GHz-81 GHz.

It is noted that, in this embodiment, each of the first to fifth bypass capacitors (Cby1-Cby5) can filter out variations of the corresponding voltage (V1-V5). However, in other embodiments, the first to fifth bypass capacitors (Cby1-Cby5) may be omitted.

While the di s closure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A low noise amplifier including:
   a first T-type circuit adapted to be coupled to a signal source for receiving an input signal therefrom, filtering the input signal to generate a filtered signal, and configured such that an equivalent input impedance seen into said first T-type circuit matches an equivalent output impedance seen into the signal source;
   a first amplification module coupled to said first T-type circuit for receiving the filtered signal therefrom, and amplifying the filtered signal to generate an amplified signal; and
   a second amplification module coupled to said first amplification module for receiving the amplified signal therefrom, and amplifying the amplified signal to generate an output signal;
   said low noise amplifier being characterized in that said second amplification module includes
   a third T-type circuit coupled to said first amplification module for receiving the amplified signal therefrom,
   a second transistor having a first terminal, a second terminal that is coupled to ground, and a control terminal that is coupled to said third T-type circuit,
   an eighth inductor having a first terminal, and a second terminal that is coupled to said first terminal of said second transistor,
   a third transistor having a first terminal, a second terminal that is coupled to said first terminal of said eighth inductor, and a control terminal,
   a ninth inductor having a first terminal that is coupled to said control terminal of said third transistor, and a second terminal that is adapted to receive a third voltage, and a fourth T-type circuit coupled to said first terminal of said third transistor, and outputting the output signal.

2. The low noise amplifier of claim 1, wherein said first T-type circuit includes:
a first capacitor having a first terminal that is adapted to receive the input signal, and a second terminal;
a first inductor having a first terminal that is coupled to said second terminal of said first capacitor, and a second terminal;
a second inductor having a first terminal that is coupled to said second terminal of said first inductor, and a second terminal that is adapted to receive a first voltage; and
a third inductor having a first terminal that is coupled to said second terminal of said first inductor, and a second terminal that is coupled to said first amplification module for outputting the filtered signal thereto.

3. The low noise amplifier of claim 2, wherein each of said first to third inductors of said first T-type circuit is a transmission line inductor.

4. The low noise amplifier of claim 2, wherein said first terminal of said first capacitor of said first T-type circuit is adapted to be coupled to the signal source for receiving the input signal therefrom, and said first to third inductors of said first T-type circuit are configured such that the equivalent input impedance seen into said first T-type circuit from said first terminal of said first capacitor matches the equivalent output impedance seen into the signal source.

5. The low noise amplifier of claim 2, wherein said first amplification module includes:
a first transistor having a first terminal, a second terminal, and a control terminal that is coupled to said second terminal of said third inductor of said first T-type circuit for receiving the filtered signal therefrom;
a fourth inductor coupled between said second terminal of said first transistor and ground; and
a second T-type circuit coupled to said first terminal of said first transistor, and coupled further to said second amplification module for outputting the amplified signal thereto.

6. The low noise amplifier of claim 5, wherein said second T-type circuit of said first amplification module includes:
a fifth inductor having a first terminal, and a second terminal that is coupled to said first terminal of said first transistor;
a sixth inductor having a first terminal that is adapted to receive a second voltage, and a second terminal that is coupled to said first terminal of said fifth inductor; and
a seventh inductor having a first terminal that is coupled to said first terminal of said fifth inductor, and a second terminal that is coupled to said second amplification module for outputting the amplified signal thereto.

7. The low noise amplifier of claim 6, wherein said third T-type circuit of said second amplification module is coupled to said second terminal of said seventh inductor of said second T-type circuit for receiving the amplified signal therefrom.

8. The low noise amplifier of claim 7, wherein said third T-type circuit of said second amplification module includes:
a second capacitor having a first terminal that is coupled to said second terminal of said seventh inductor for receiving the amplified signal therefrom, and a second terminal;
a tenth inductor having a first terminal that is coupled to said second terminal of said second capacitor, and a second terminal;
an eleventh inductor having a first terminal that is coupled to said second terminal of said tenth inductor, and a second terminal that is adapted to receive a fourth voltage; and
a twelfth inductor coupled between said second terminal of said tenth inductor and said control terminal of said second transistor.

9. The low noise amplifier of claim 8, wherein said fifth to seventh inductors of said second T-type circuit and said tenth to twelfth inductors of said third T-type circuit are configured such that an equivalent input impedance seen into said second amplification module from said first terminal of said second capacitor matches an equivalent output impedance seen into said first amplification module from said second terminal of said seventh inductor.

10. The low noise amplifier of claim 7, wherein said fourth T-type circuit of said second amplification module includes:
a thirteenth inductor having a first terminal, and a second terminal that is coupled to said first terminal of said third transistor;
a fourteenth inductor having a first terminal that is adapted to receive a fifth voltage, and a second terminal that is coupled to said first terminal of said thirteenth inductor;
a fifteenth inductor having a first terminal that is coupled to said first terminal of said thirteenth inductor, and a second terminal; and
a third capacitor having a first terminal that is coupled to said second terminal of said fifteenth inductor, and a second terminal that outputs the output signal.

11. The low noise amplifier of claim 1, wherein said first amplification module includes:
a first transistor having a first terminal, a second terminal, and a control terminal that is coupled to said first T-type circuit for receiving the filtered signal therefrom;
a fourth inductor coupled between said second terminal of said first transistor and ground; and
a second T-type circuit coupled to said first terminal of said first transistor, and coupled further to said second amplification module for outputting the amplified signal thereto.

12. The low noise amplifier of claim 11, wherein said second T-type circuit of said first amplification module includes:
a fifth inductor having a first terminal, and a second terminal that is coupled to said first terminal of said first transistor;
a sixth inductor having a first terminal that is adapted to receive a second voltage, and a second terminal that is coupled to said first terminal of said fifth inductor; and
a seventh inductor having a first terminal that is coupled to said first terminal of said fifth inductor, and a second terminal that is coupled to said second amplification module for outputting the amplified signal thereto.

13. The low noise amplifier of claim 12, wherein each of said fourth to seventh inductors is a transmission line inductor.

14. The low noise amplifier of claim 1, wherein said third T-type circuit of said second amplification module includes:
a second capacitor having a first terminal that is coupled to said first amplification module for receiving the amplified signal therefrom, and a second terminal;
a tenth inductor having a first terminal that is coupled to said second terminal of said second capacitor, and a second terminal;

an eleventh inductor having a first terminal that is coupled to said second terminal of said tenth inductor, and a second terminal that is adapted to receive a fourth voltage; and a twelfth inductor coupled between said second terminal of said tenth inductor and said control terminal of said second transistor.

15. The low noise amplifier of claim 14, wherein each of said eighth to twelfth inductors of said second amplification module is a transmission line inductor.

16. The low noise amplifier of claim 1, wherein said fourth T-type circuit of said second amplification module includes:

a thirteenth inductor having a first terminal, and a second terminal that is coupled to said first terminal of said third transistor;

a fourteenth inductor having a first terminal that is adapted to receive a fifth voltage, and a second terminal that is coupled to said first terminal of said thirteenth inductor;

a fifteenth inductor having a first terminal that is coupled to said first terminal of said thirteenth inductor, and a second terminal; and a third capacitor having a first terminal that is coupled to said second terminal of said fifteenth inductor, and a second terminal that outputs the output signal.

17. The low noise amplifier of claim 16, wherein each of said eighth, ninth and thirteenth to fifteenth inductors of said second amplification module is a transmission line inductor.

18. The low noise amplifier of claim 16, wherein said second terminal of said third capacitor of said fourth T-type circuit is adapted to be coupled to an end terminal circuit for outputting the output signal thereto, and said thirteenth to fifteenth inductors of said fourth T-type circuit are configured such that an equivalent output impedance seen into said second amplification module from said second terminal of said third capacitor of said fourth T-type circuit matches an equivalent input impedance seen into the end terminal circuit.

* * * * *